United States Patent
Huang et al.

(10) Patent No.: US 8,503,233 B2
(45) Date of Patent: Aug. 6, 2013

(54) METHOD OF TWICE PROGRAMMING A NON-VOLATILE FLASH MEMORY WITH A SEQUENCE

(75) Inventors: Han-Lung Huang, Hsinchu (TW);
Ming-Hung Chou, Hsinchu (TW);
Chien-Fu Huang, Hsinchu (TW);
Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 387 days.

(21) Appl. No.: 12/831,612

(22) Filed: Jul. 7, 2010

(65) Prior Publication Data
US 2012/0008387 A1    Jan. 12, 2012

(51) Int. Cl.
*G11C 16/04* (2006.01)
(52) U.S. Cl.
USPC .................. 365/185.03; 365/185.18

(58) Field of Classification Search
USPC ........................... 365/185.03, 185.18
See application file for complete search history.

(56) References Cited

U.S. PATENT DOCUMENTS

| | | | |
|---|---|---|---|
| 6,657,891 B1 | 12/2003 | Shibata et al. | |
| 7,224,613 B2 | 5/2007 | Chen et al. | |
| 8,339,845 B2 * | 12/2012 | Kwon | 365/185.03 |
| 2007/0279989 A1 * | 12/2007 | Aritome | 365/185.18 |
| 2011/0292725 A1 * | 12/2011 | Choi et al. | 365/185.03 |

* cited by examiner

*Primary Examiner* — Huan Hoang
(74) *Attorney, Agent, or Firm* — Muncy, Geissler, Olds & Lowe, PLLC

(57) ABSTRACT

A method of twice programming a multi-bit per cell non-volatile memory with a sequence is disclosed. At least one page at a given word line is firstly programmed with program data by a controller of the non-volatile memory, and at least one page at a word line preceding the given word line is secondly programmed with the same program data by the controller.

13 Claims, 16 Drawing Sheets

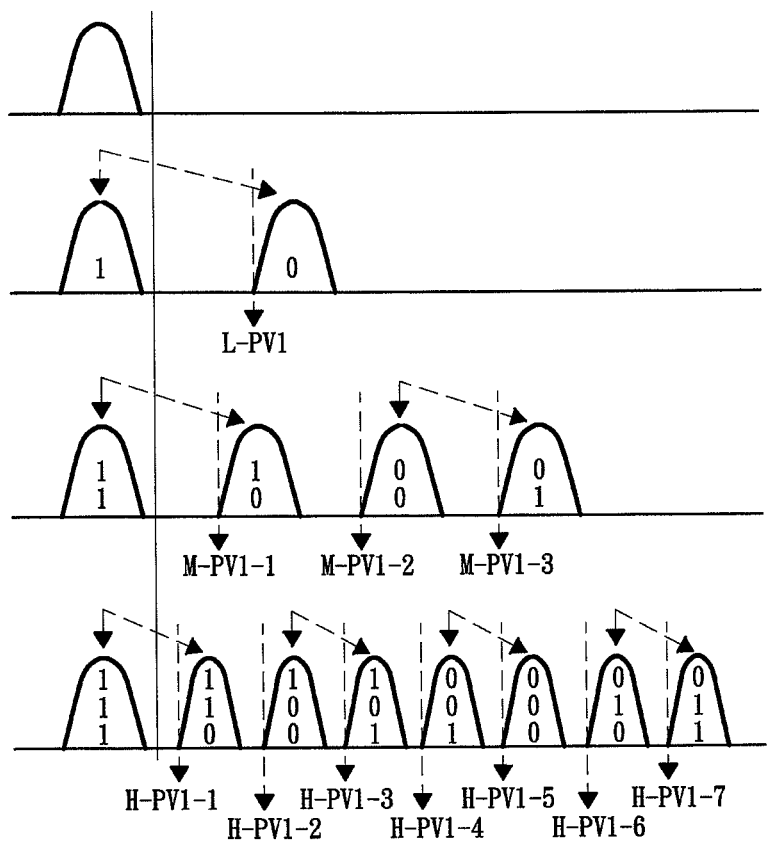

|     | L-bit | M-bit | H-bit |
|-----|-------|-------|-------|
| WL0 | 00h | 02h | 05h |
| WL1 | 01h | 04h | 08h |
| WL2 | 03h | 07h | 0Bh |
| WL3 | 06h | 0Ah | 0Eh |
| ... |     | ... | ... |
| WL61 | B4h | B8h | BCh |
| WL62 | B7h | BBh | BEh |
| WL63 | BAh | BDh | BFh |

FIG. 5A (PRIOR ART)

|     | L-bit | M-bit | H-bit |
|-----|-------|-------|-------|
| WL0 | 00h | 02h | 05h |
| WL1 | 01h | 04h | 08h |
| WL2 | 03h | 07h | 0Bh |
| WL3 | 06h | 0Ah | 0Eh |
| ... |     | ... | ... |
| WL61 | B4h | B8h | BCh |
| WL62 | B7h | BBh | BEh |
| WL63 | BAh | BDh | BFh |

FIG. 5B

|  | L-bit | M-bit | H-bit |
|---|---|---|---|
| WL0 | 00h | 02h | 05h |
| WL1 | 01h | 04h | 08h |
| WL2 | 03h | 07h | 0Bh |
| WL3 | 06h | 0Ah | 0Eh |
| WL4 | 09h | 0Dh | 11h |
| WL5 | 0Ch | 10h | 14h |
| WL6 | 0Fh | 13h | 17h |
| WL7 | 12h | 16h | 1Ah |
| ... |  | ... | ... |
| WL61 | B4h | B8h | BCh |
| WL62 | B7h | BBh | BEh |
| WL63 | BAh | BDh | BFh |

FIG. 5C

|  | L-bit | M-bit | H-bit |
|---|---|---|---|
| WL0 | 00 | 02 | 05 |
| WL1 | 01 | 04 | 08 |
| WL2 | 03 | 07 | 0B |
| WL3 | 06 | 0A | 0E |
| ... |  | ... | ... |
| WL61 | B4 | B8 | BC |
| WL62 | B7 | BB | BE |
| WL63 | BA | BD | BF |

FIG. 5D

|  | L-bit | M-bit | H-bit |
|---|---|---|---|
| WL0 | 00h | 02h |  |
| WL1 | (01h) |  |  |
| WL2 | 03h |  |  |
| WL3 |  |  |  |
| ... |  |  |  |
| WL61 |  |  |  |
| WL62 |  |  |  |
| WL63 |  |  |  |

FIG. 6A (PRIOR ART)

|  | L-bit | M-bit | H-bit |
|---|---|---|---|
| WL0 | 00h | 02h |  |
| WL1 | (01h) |  |  |
| WL2 | 03h |  |  |
| WL3 | 06h |  |  |
| ... |  |  |  |
| WL61 | B4h |  |  |
| WL62 | B7h |  |  |
| WL63 | BAh |  |  |

FIG. 6B

|      | L-bit | M-bit | H-bit |
|------|-------|-------|-------|
| WL0  | 00h   | 02h   | 05h   |
| WL1  | 01h   | 04h   |       |
| WL2  | 03h   | 07h   |       |
| WL3  | 06h   |       |       |
| ...  |       |       |       |
| WL61 |       |       |       |
| WL62 |       |       |       |
| WL63 |       |       |       |

FIG. 6C (PRIOR ART)

|      | L-bit | M-bit | H-bit |
|------|-------|-------|-------|
| WL0  | 00h   | 02h   | 05h   |
| WL1  | 01h   | 04h   |       |
| WL2  | 03h   | 07h   |       |
| WL3  | 06h   | 0Ah   |       |
| ...  |       | ...   |       |
| WL61 | B4h   | B8h   |       |
| WL62 | B7h   | BBh   |       |
| WL63 | BAh   | BDh   |       |

FIG. 6D

|  | L-bit | M-bit | H-bit |
|---|---|---|---|
| WL0 | 00h | 02h | 05h |
| WL1 | 01h | 04h | 08h |
| WL2 | 03h | 07h | 0Bh |
| WL3 | 06h | 0Ah |  |
| WL4 | 09h |  |  |
| ... |  |  |  |
| WL62 |  |  |  |
| WL63 |  |  |  |

FIG. 6E (PRIOR ART)

|  | L-bit | M-bit | H-bit |
|---|---|---|---|
| WL0 | 00h | 02h | 05h |
| WL1 | 01h | 04h | 08h |
| WL2 | 03h | 07h | 0Bh |
| WL3 | 06h | 0Ah |  |
| ... | ... | ... |  |
| WL61 | B4h | B8h |  |
| WL62 | B7h | BBh |  |
| WL63 | BAh | BDh |  |

FIG. 6F

|       | L-bit | M-bit | H-bit |
|-------|-------|-------|-------|
| WL0   | 00h   | 02h   | (05h) |
| WL1   | 01h   | 04h   | 08h   |
| WL2   | 03h   | 07h   | 0Bh   |
| WL3   | 06h   | 0Ah   | (0Eh) |
| WL4   | 09h   | 0Dh   | 11h   |
| WL5   | 0Ch   | 10h   | 14h   |
| WL6   | 0Fh   | 13h   | (17h) |
| WL7   | 12h   | 16h   | 1Ah   |
| ...   |       | ...   | ...   |
| WL61  | B4h   | B8h   | BCh   |
| WL62  | B7h   | BBh   | BEh   |
| WL63  | BAh   | BDh   | (BFh) |

FIG. 9A (PRIOR ART)

|       | L-bit | M-bit | H-bit |
|-------|-------|-------|-------|
| WL0   | 00h   | 02h   | 05h   |
| WL1   | 01h   | 04h   | 08h   |
| WL2   | 03h   | 07h   | 0Bh   |
| WL3   | 06h   | 0Ah   | 0Eh   |
| WL4   | 09h   | 0Dh   | 11h   |
| WL5   | 0Ch   | 10h   | 14h   |
| WL6   | 0Fh   | 13h   | 17h   |
| WL7   | 12h   | 16h   | (1Ah) |
| ...   |       | ...   | ...   |
| WL61  | B4h   | B8h   | BCh   |
| WL62  | B7h   | BBh   | BEh   |
| WL63  | BAh   | BDh   | (BFh) |

FIG. 9B

METHOD OF TWICE PROGRAMMING A NON-VOLATILE FLASH MEMORY WITH A SEQUENCE

BACKGROUND OF THE INVENTION

1. Field of the Invention

The present invention generally relates to a non-volatile memory, and more particularly to a method of twice programming a multi-bit per cell non-volatile memory with a sequence.

2. Description of Related Art

Flash memory is a non-volatile solid state memory device that can be electrically erased and reprogrammed. Conventional flash memory stores a single bit of information in each memory cell such that each memory cell can be programmed to assume two possible states. The conventional flash memory is thus commonly referred to as single-bit per cell flash memory. Modern flash memory is capable of storing two or more bits of information in each memory cell such that each memory cell can be programmed to assume more than two possible states. The modern flash memory is thus commonly referred to as multi-bit per cell flash memory.

In the multi-bit per cell flash memory, data of different state are programmed to the flash memory by storing different amount of charge in the floating gate of the flash memory. As the charge in the floating gate specifically determines the corresponding threshold voltage, the data can then be read from the multi-bit cell per flash memory according to their different threshold voltage. Due to variations among the memory cells during the manufacture, operation or according to other factors, the threshold voltage of each state is not a constant value but a range.

However, conventional multi-bit per cell flash memory, particularly the three-bit per cell or even more-bit per cell flash memory, suffers from floating-gate coupling effect and retention effect. As a result, the conventional multi-bit per cell flash memory could probably result in read errors due to narrow read margin, and a need has thus arisen to propose some novel schemes to improve floating-gate coupling effect and retention effect.

SUMMARY OF THE INVENTION

In view of the foregoing, it is an object of the embodiment of the present invention to provide a method of twice programming a multi-bit per cell non-volatile memory with a sequence in order to improve floating-gate coupling effect and retention effect.

According to one embodiment, at least one page of at least one word line is firstly programmed with program data by a controller of the non-volatile memory, and said at least one page of at least one word line is secondly programmed with the same program data by the controller.

According to another embodiment, a number of less-significant-bit pages are programmed or read, and a number of consecutive most-significant-bit pages are programmed or read one after the other in a consecutive order.

According a further embodiment, at least one page at a given word line is firstly programmed with program data by a controller of the non-volatile memory, and at least one page at a word line preceding the given word line is secondly programmed with the same program data by the controller.

BRIEF DESCRIPTION OF THE DRAWINGS

FIGS. 2A-2D show exemplary distributions of threshold voltage of a three-bit per cell flash memory with respect to the pass-verify (PV) voltage;

FIG. 5A shows a conventional page program/read sequence in a memory block for a three-bit per cell flash memory;

FIG. 5B shows one page program/read sequence in a memory block for a three-bit per cell flash memory according to one embodiment of the present invention;

FIG. 5C shows another page program/read sequence (as indicated by the arrows) in a memory block for a three-bit per cell flash memory according to another embodiment of the present invention;

FIG. 5D shows a further page program/read sequence (as indicated by the arrows) in a memory block for a three-bit per cell flash memory according to a further embodiment of the present invention;

FIGS. 6A-6F shows some comparing examples between the conventional program/read sequence and the novel program/read sequence regarding their effectiveness in overcoming the floating-gate coupling effect;

FIG. 9A shows a programming example using the conventional sequence; and

FIG. 9B shows a programming example using the novel sequence.

DETAILED DESCRIPTION OF THE INVENTION

Figure 1A:
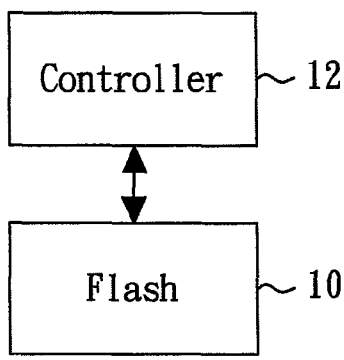
FIG. 1A schematically shows a simplified block diagram of a non-volatile memory system according to one embodiment of the present invention.
Figure 1B:
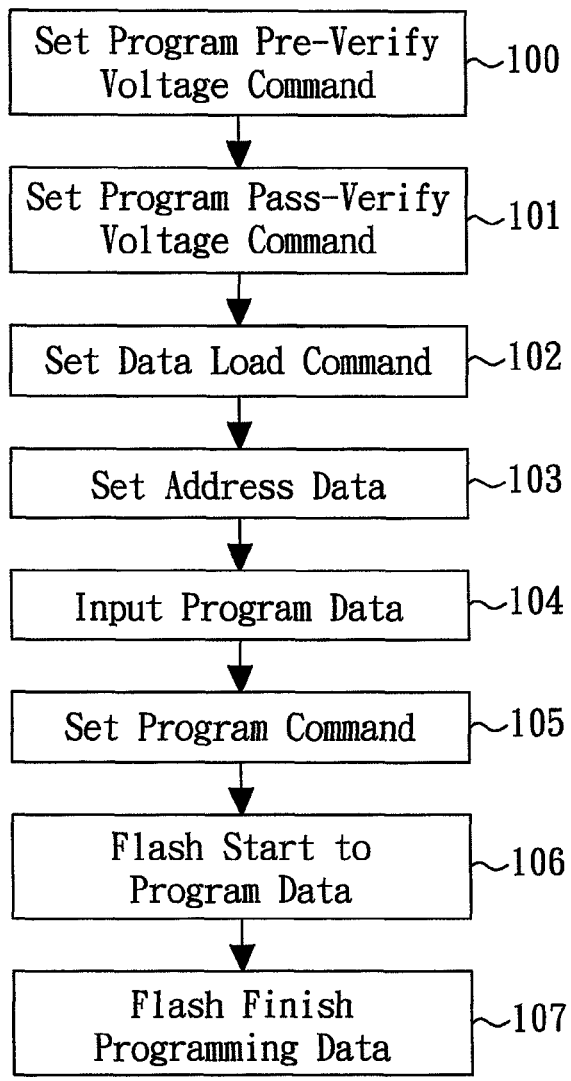
FIG. 1B generally shows a flow diagram that illustrates programming the flash memory by the controller.

FIG. 1A schematically shows a simplified block diagram of a non-volatile memory system such as a flash memory system according to one embodiment of the present invention. Other non-volatile memory may, for example, be a phase change memory (PCM) or an electrically erasable programmable read-only memory (EEPROM). In the embodiment, the flash memory system includes a flash memory 10, particularly a multi-bit per cell NAND flash memory. The flash memory system also includes a controller 12 that is configured to twice program the flash memory 10. The controller 12 may be implemented by hardware circuitry, software or their combination. Although a three-bit per cell flash memory is specifically illustrated in the following embodiments, it is appreciated that the embodiments may be adapted for other multi-bit per cell flash memory such as a two-bit per cell flash memory or a four-bit per cell flash memory. FIG. 1B generally shows a flow diagram that illustrates programming the flash memory 10 by the controller 12. Specifically, a program pre-verify (PreV) voltage command is set (block 100), followed by setting a program pass-verify (PV) voltage command (block 101). Subsequently, data load command is set (block 102), address data are set (block 103), and program data are inputted (block 104). After a program command is set (block 105), the flash memory 10 starts to program the data (block 106) until the flash memory 10 finishes programming the data (block 107).

FIGS. 2A-2D show exemplary distributions of threshold voltage of a three-bit per cell flash memory with respect to the pass-verify (PV) voltage. Each cell of the three-bit per cell flash memory is capable of storing three bits, i.e., a high bit, a middle bit and a low bit, which correspond to a high-bit page, a mid-bit page and a low-bit page respectively. Specifically, FIG. 2A shows a distribution of a word line (WL) after erase. FIG. 2B shows a distribution of the word line after the low-bit page is (firstly) programmed using a low-bit pass-verify voltage L-PV1, which is a low-bound voltage for the state "0." FIG. 2C shows a distribution of the word line after the mid-bit page is (firstly) programmed using mid-bit pass-verify voltages M-PV1-1, M-PV1-2 and M-PV1-3, which are low-bound voltages for the states "10", "00" and "01" respectively. FIG. 2D shows a distribution of the word line after the high-bit page is (firstly) programmed using high-bit pass-verify voltages H-PV1-1 through H-PV1-7, which are low-bound voltages for the states "110" to "011" respectively.

Figures 3A, 3B, 3C, 3D:
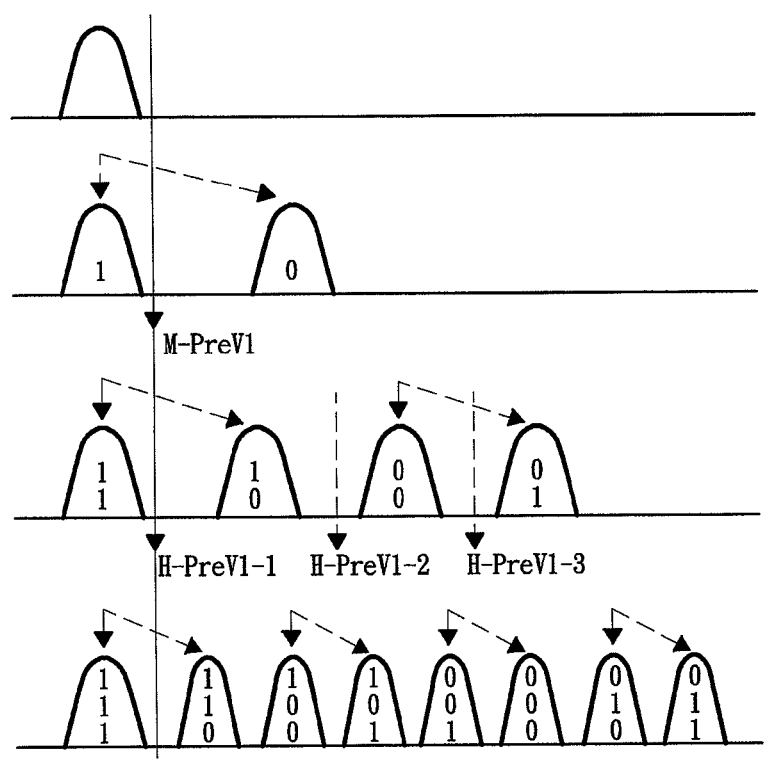
FIGS. 3A-3D show exemplary distributions of threshold voltage of a three-bit per cell flash memory with respect to the pre-verify (PreV) voltage.

FIGS. 3A-3D show exemplary distributions of threshold voltage of a three-bit per cell flash memory with respect to the pre-verify (PreV) voltage. Specifically, FIG. 3A shows a distribution of a word line (WL) after erase. FIG. 3B shows a distribution of the word line after the low-bit page is (firstly) programmed. Before (firstly) programming the mid-bit page, a mid-bit pre-verify voltage M-PreV1 is used to check the current states. FIG. 3C shows a distribution of the word line after the mid-bit page is (firstly) programmed. Before (firstly) programming the high-bit page, high-bit pre-verify voltages H-PreV1-1, H-PreV1-2 and H-PreV1-3 are used to check the current states. FIG. 3D shows a distribution of the word line after the high-bit page is (firstly) programmed.

Figure 4A:
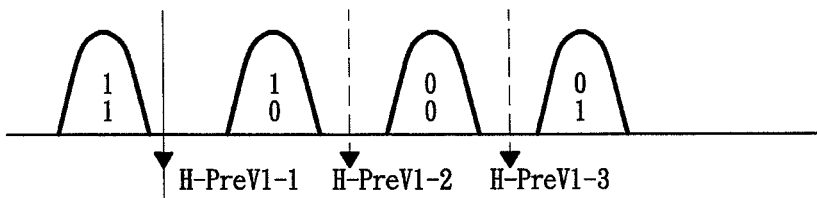
FIGS. 4A-4D show exemplary distributions of threshold voltage of a three-bit per cell flash memory according to one embodiment of the present invention.
Figure 4B:
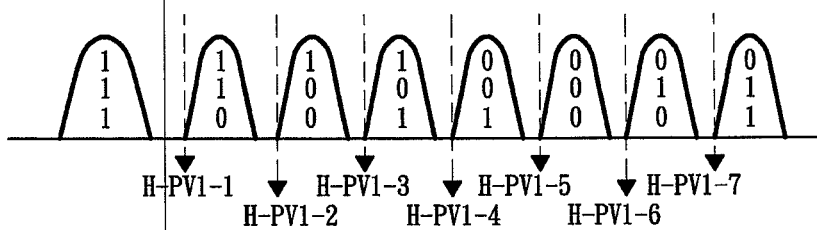
Figure 4C:
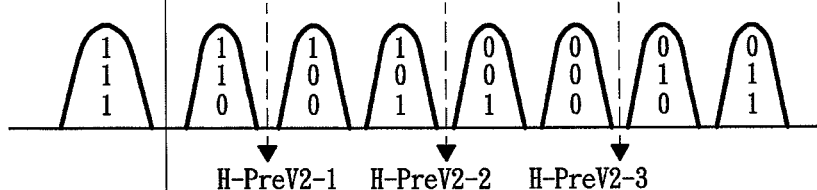
Figure 4D:
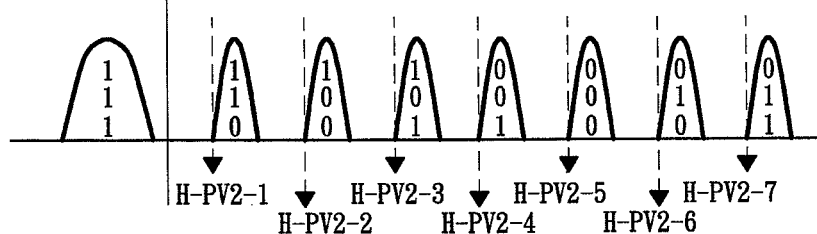

According to one aspect of the present invention, at least one page (e.g., a high-bit page) of at least one word line (WL) of the flash memory 10 is twice programmed by the controller 12 in order to improve floating-gate coupling effect or/and retention effect. FIGS. 4A-4D show exemplary distributions of threshold voltage of a three-bit per cell flash memory according to one embodiment of the present invention. Specifically, FIG. 4A shows a distribution of a word line (WL) after the less-significant-bit pages (e.g., the low-bit page and the mid-bit page) are firstly programmed. Before firstly programming the high-bit page, first high-bit pre-verify voltages H-PreV1-1, H-PreV1-2 and H-PreV1-3 are determined. FIG. 4B shows a distribution of the word line after the most-significant-bit page (e.g., the high-bit page) is firstly programmed using the first high-bit pre-verify voltages H-PreV1 (i.e., H-PreV1-1, H-PreV1-2 and H-PreV1-3) and first high-bit pass-verify voltages H-PV1-1 to H-PV1-7. Subsequently, as shown in FIG. 4C, second high-bit pre-verify voltages H-PreV2 (i.e., H-PreV2-1, H-PreV2-2 and H-PreV2-3) are determined and will be used later. It is noted that the determined second pre-verify voltages H-PreV2 and the first pre-verify voltages H-PreV1 should have substantially the same read results. FIG. 4D shows a distribution of the word line after the high-bit page is secondly programmed using the second high-bit pre-verify voltages H-PreV2 (i.e., H-PreV2-1, H-PreV2-2 and H-PreV2-3) and second high-bit pass-verify voltages H-PV2-1 to H-PV2-7. It is further noted that the secondly program data should be the same as the firstly program data. It is observed that the second pass-verify voltages H-PV2 are respectively greater than or equal to the first pass-verify voltages H-PV1. For example, in this embodiment, the second pass-verify voltage H-PV2-1 of the state "110" is greater than the first pass-verify voltage H-PV1-1 for the same state "110." As a result, the width (or window) of the distribution becomes smaller, and the distance (or margin) between neighboring distributions becomes greater, thereby increasing read margin of the flash memory. Generally speaking, the second pass-verify voltage H-PV2 is greater than or equal to the first pass-verify voltage H-PV1 but less than the high-bound voltage of the same state.

According to another aspect of the present invention, a novel page program or read sequence is disclosed. FIG. 5A shows a conventional page program/read sequence in a memory block for a three-bit per cell flash memory, which performs page program/read in the following order:

00h→01h→02h→03h→04h→05h→06h→07h→ . . . →BDh→BEh→BFh.

Wherein the page is the program unit and the block is the erase unit in the flash memory.

FIG. 5B shows one page program/read sequence in a memory block for a three-bit per cell flash memory according to one embodiment of the present invention. The three-bit per cell flash memory performs page program/read in the following novel order:

00h→01h→03h→06h→ . . . B7h→Bah→02h→04h→ . . . →BCh→BEh→BFh.

Specifically, the three-bit per cell flash memory firstly programs/reads low-bit pages through all the word lines of the memory block (e.g., WL0 through WL63), followed by programming/reading mid-bit pages through all the word lines of the memory block (e.g., WL0 through WL63). Finally, the three-bit per cell flash memory programs/reads high-bit pages through all the word lines of the memory block (e.g., WL0 through WL63).

FIG. 5C shows another page program/read sequence (as indicated by the arrows) in a memory block for a three-bit per cell flash memory according to another embodiment of the present invention. Specifically, a number of low-bit pages (e.g., eight pages in this example) are programmed/read, and a number of mid-bit pages are programmed/read, followed by programming/reading a number of high-bit pages.

FIG. 5D shows a further page program/read sequence (as indicated by the arrows) in a memory block for a three-bit per cell flash memory according to a further embodiment of the present invention. Specifically, the low-bit pages and the mid-bit pages are programmed/read according to the conventional sequence (FIG. 5A), followed by programming/reading high-bit pages through all the word lines of the memory block (e.g., WL0 through WL63). Generally speaking, at least some consecutive high-bit pages are programmed/read after programming/reading some less-significant-bit (e.g., low-bit and mid-bit) pages. In other words, the flash memory performs programming/reading at least some of the high-bit pages in a consecutive order, according to which the high-bit pages are programmed/read one after the other.

FIGS. 6A-6F shows some comparing examples between the conventional program/read sequence and the novel program/read sequence regarding their effectiveness in overcoming the floating-gate coupling effect. It is shown in FIG. 6A a conventional sequence, according to which the low-bit page 01h at word line WL1 is affected by the mid-bit page 02h at word line WL0 and the low-bit page 03h at word line WL2. On the other hand, it is shown in FIG. 6B a novel sequence, according to which the low-bit page 01h at word line WL1 is affected in the same manner, i.e., by the mid-bit page 02h at word line WL0 and the low-bit page 03h at word line WL2.

It is shown in FIG. 6C a conventional sequence, according to which the mid-bit page 04h at word line WL1 is affected by the high-bit page 05h at word line WL0 and the mid-bit page 07h at word line WL2. On the other hand, it is shown in FIG. 6D a novel sequence, according to which the high-bit page 04h at word line WL1 is affected in the same manner, i.e., by the high-bit page 05h at word line WL0 and the mid-bit page 07h at word line WL2.

It is further shown in FIG. 6E a conventional sequence, according to which the high-bit page 08h at word line WL1 is affected by the high-bit page 0Bh at word line WL2. On the other hand, it is shown in FIG. 6F a novel sequence, according to which the high-bit page 08h at word line WL1 is affected in the same manner, i.e., by the high-bit page 0Bh at word line WL2.

According to the novel program/read sequence of the embodiments, the consecutive high-bit pages corresponding to the consecutive word lines may be programmed at one time. As a result, the variation between neighboring programmed pages may thus be substantially reduced.

Figure 7:
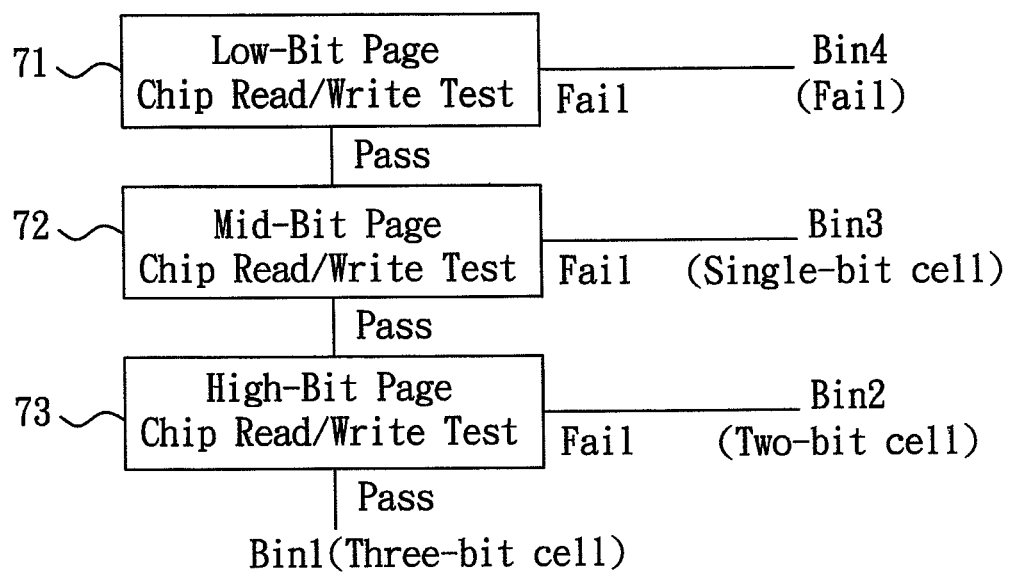
FIG. 7 shows a flow diagram of a three-bit per cell chip read/write test.

The novel program/read sequence may be advantageously adapted to a read/write test on the multi-bit per cell flash memory. FIG. 7 shows a flow diagram of a three-bit per cell chip read/write test. In step 71, the low-bit pages are tested. If the chip fails the test, the chip is then sorted into a fail bin (Bin4), otherwise the flow proceeds to the next step. In step 72, mid-bit pages are tested. If the chip fails the test, the chip is then sorted into a single-bit per cell bin (Bin3); otherwise the flow proceeds to the next step. In step 73, high-bit pages are tested. If the chip fails the test, the chip is then sorted into a two-bit per cell bin (Bin2); otherwise the chip is sorted into a three-bit per cell bin (Bin1). Compared to the conventional sequence, the novel sequence of the embodiment may speed up and simplify the test, particularly when the chip to be tested belongs to Bin4, Bin3 or Bin2.

Figure 8A:
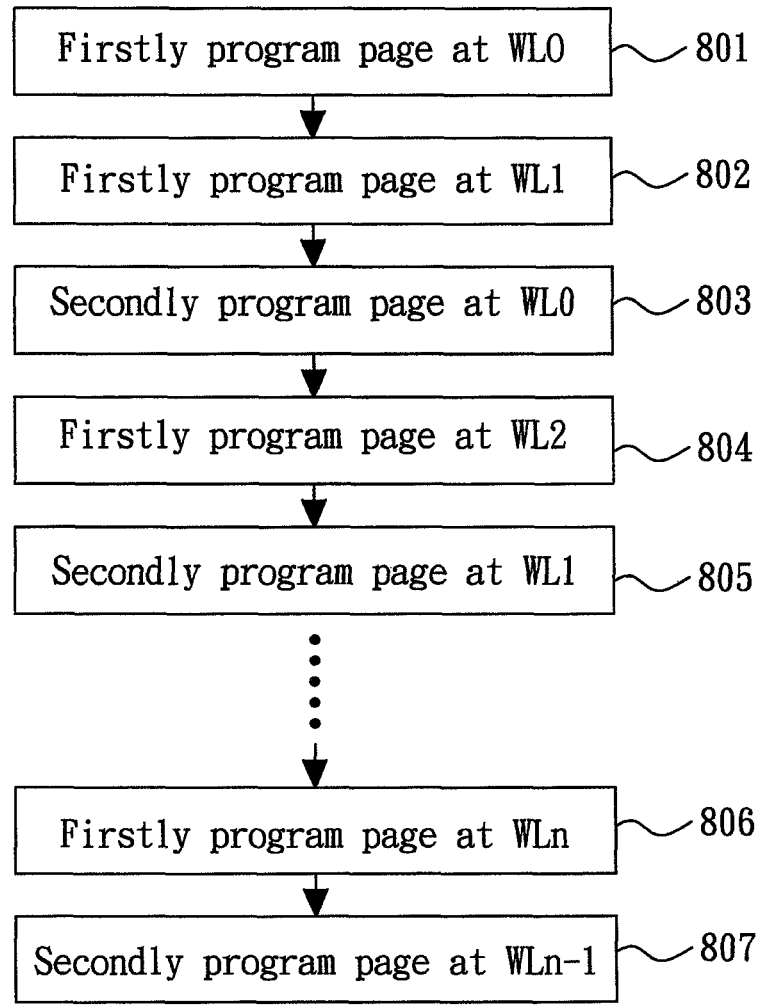
FIGS. 8A-8E show some flow diagrams of the twice-program method with the novel program sequence according to some embodiments of the present invention.

The disclosed novel program/read sequence may be adapted to the twice-program method for the flash memory (FIGS. 4A-4D). FIG. 8A shows a flow diagram of the twice-program method with the novel program sequence according to one embodiment of the present invention. Specifically, in step 801, a page (e.g., a high-bit page) at word line WL0 is firstly programmed, followed by firstly programming a page at next word line WL1. Subsequently, in step 803, a page at the preceding word line WL0 is secondly programmed. After a page at word line WL2 is firstly programmed (step 804), a page at the preceding word line WL1 is secondly programmed (step 805). The flow proceeds until a page at the last word line WLn is firstly programmed (step 806), and a page at the preceding word line WLn-1 is secondly programmed (step 807). Generally speaking, a page at a given word line, say word line WLn, is firstly programmed, followed by secondly programming a page at a word line (e.g., WLn-1) preceding the given word line.

Figure 8B:
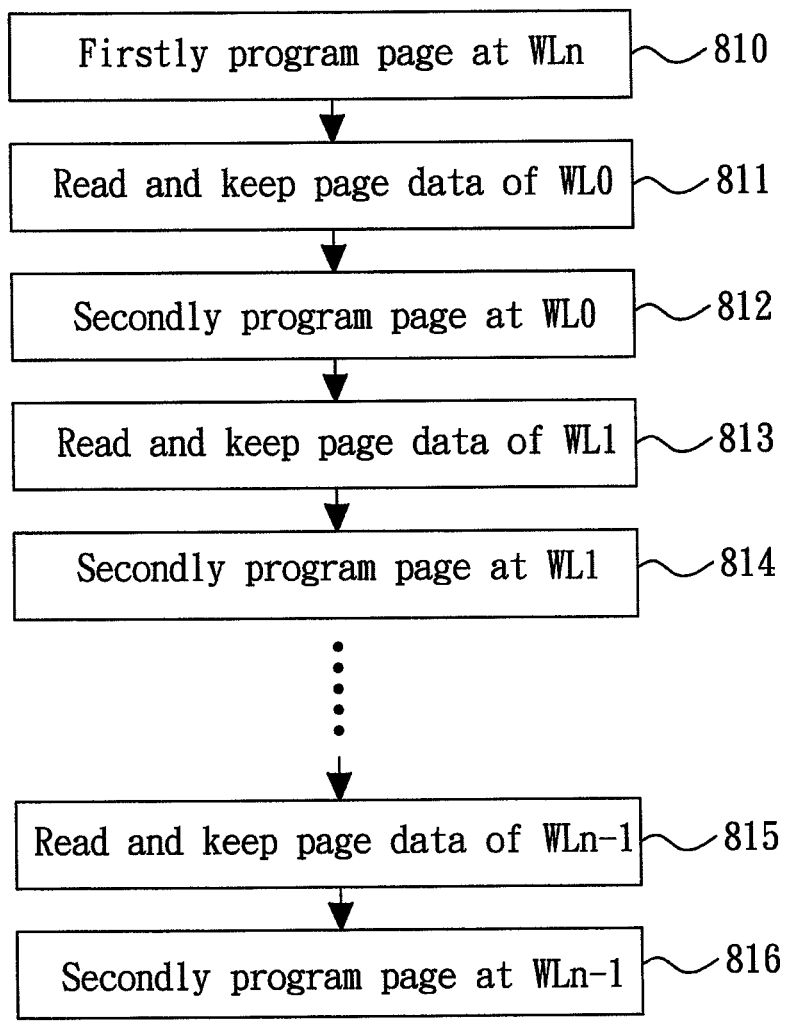

FIG. 8B shows a flow diagram of the twice-program method with the novel program sequence according to another embodiment of the present invention. Specifically, in step 810, a page (e.g., a high-bit page) at the last word line WLn is firstly programmed. Afterwards, pages of all the word lines preceding the word line WLn are secondly programmed in order (steps 812, 814 and 816). Generally speaking, after a page at a given word line, say word line WLn, is firstly programmed, pages of some word lines preceding the given word line WLn are secondly programmed in order. As the secondly program data should be the same as the firstly program data, the controller 12 (FIG. 1A), in this embodiment, reads and keeps page data of the corresponding word line (steps 811, 813 and 815), before the page is secondly programmed at the corresponding word line.

Figure 8C:
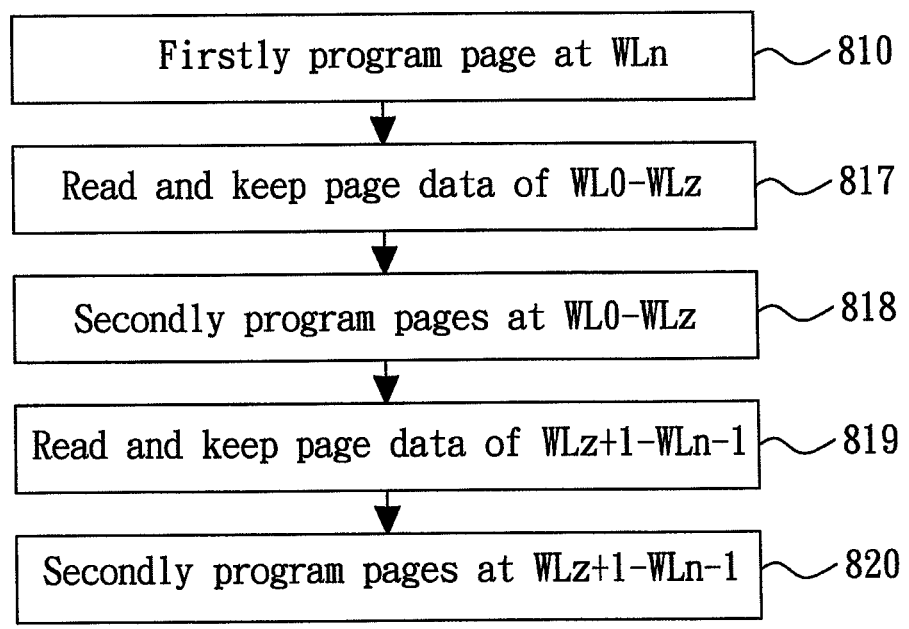

FIG. 8C shows a flow diagram of the twice-program method with the novel program sequence according to an alternative embodiment to FIG. 8B. The flow of FIG. 8C is similar to the flow of FIG. 8B with the exception that, a portion of page data (e.g., page data of WL0-WLz) are read and kept at a time (steps 817 and 819), before those pages are secondly programmed at the corresponding word lines.

Figure 8D:
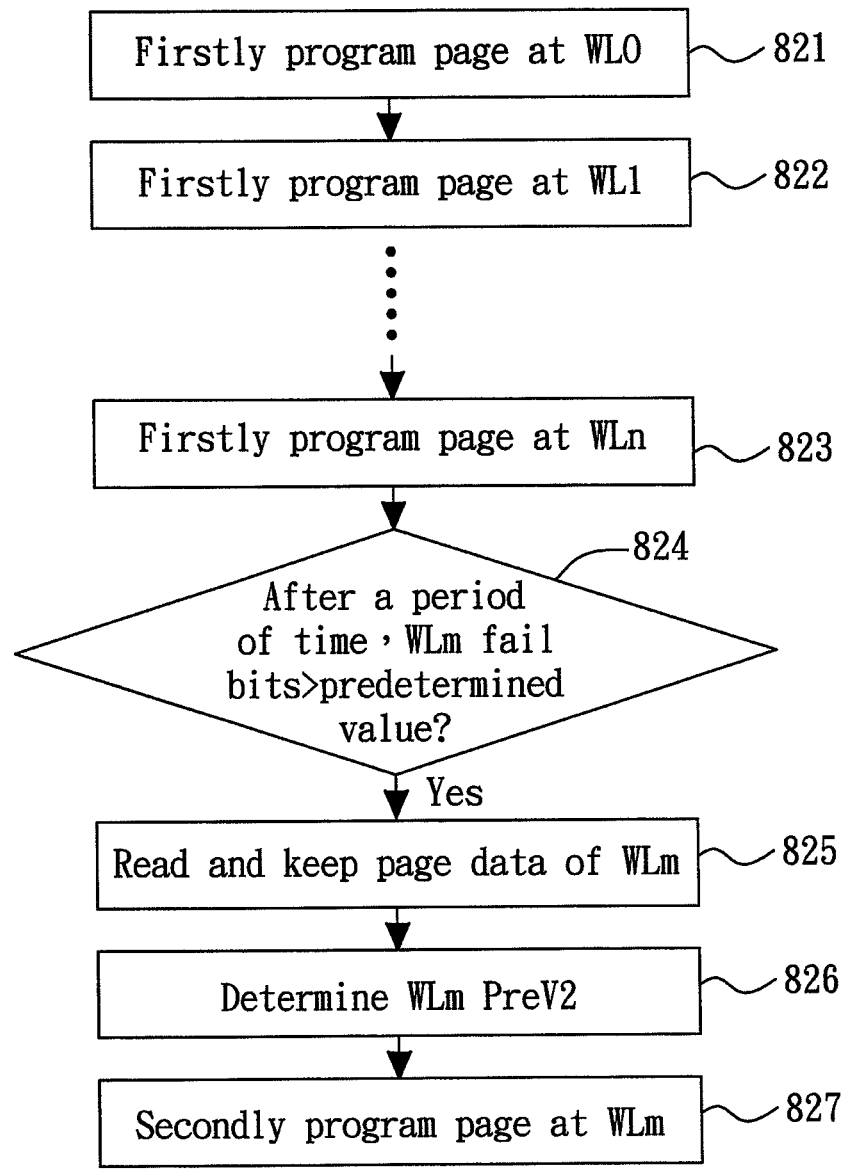

FIG. 8D shows a flow diagram of the twice-program method with the novel program sequence according to a further embodiment of the present invention. Specifically, in steps 821-823, pages (e.g., high-bit pages) at word lines WL0 through WLn are firstly programmed. After a predetermined time has been elapsed, the flash memory is checked to find any word line that is associated the amount of with fail bits greater than or equal to a predetermined value (step 824). If such a word line, say WLm, exists, the page data of the word line WLm are read and kept by the controller 12 (step 825), a second pre-verify voltage PreV2 is determined (step 826), and a page at the word line WLm is secondly programmed (step 827). Generally speaking, after a page at a given word line is firstly programmed, the flash memory is checked to find any failed word line that is associated with the amount of fail bits greater than or equal to a predetermined value. If the check result is positive, a page at the failed word line is then read and kept by the controller 12, followed by secondly programming with a determined second pre-verify voltage PreV2. The determination of the second pre-verify voltage PreV2 may be performed according to a method disclosed in an U.S. patent application Ser. No. 12/464,240, filed on May 12, 2009, entitled "METHOD AND SYSTEM FOR ADAPTIVELY FINDING REFERENCE VOLTAGES FOR READING DATA FROM A MLC FLASH MEMORY" assigned to the same assignee of the present application, the disclosure of which is hereby incorporated by reference. For example, the determined second pre-verify voltage has a corresponding normalized number of cells approximate to the normalized number of the cells corresponding to a first pre-verify voltage.

Figure 8E:
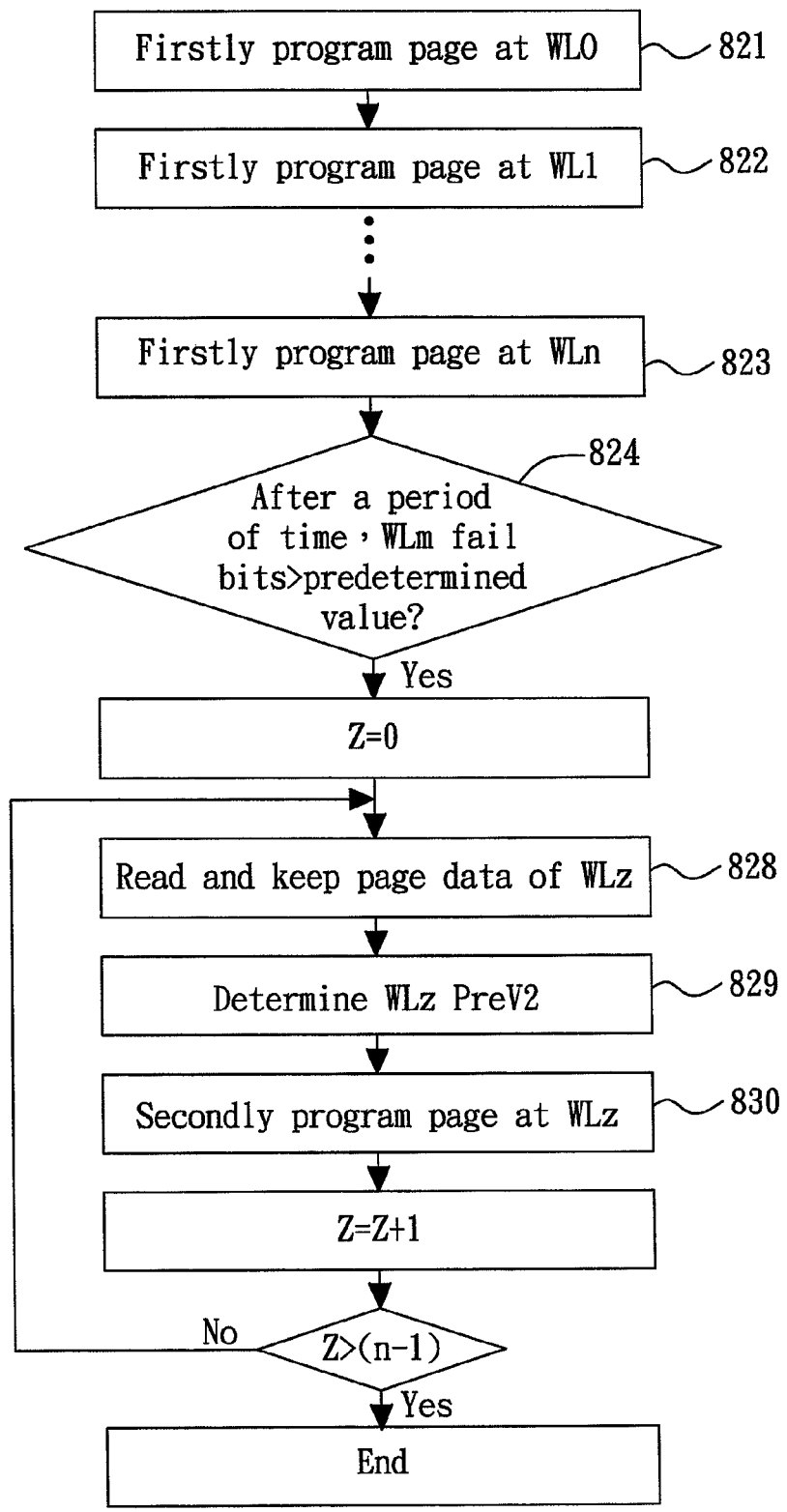

FIG. 8E shows a flow diagram of the twice-program method with the novel program sequence according to an alternative embodiment to FIG. 8D. The flow of FIG. 8E is similar to the flow of FIG. 8D, with the exception that, if the check result instep 824 is positive, pages at all the word lines preceding the word line WLn are read and kept by the controller 12 (steps 828), followed by secondly programming in order (step 830) with a determined second pre-verify voltage PreV2 (step 829).

The twice-program using the novel program sequence can better prevent retention effect compared to the twice-program using the conventional program sequence. FIG. 9A shows a programming example using the conventional sequence, in which 8 pages are programmed at a time. FIG. 9B shows a programming example using the novel sequence, in which 8 pages are programmed at a time. It is noted that the last high-bit page of each programming cannot be twice programmed until the succeeding high-bit page has been (firstly) programmed, thereby resulting in retention effect. For example, the high-bit page 05h can only be secondly programmed after the succeeding high-bit page 08h has been firstly programmed. It is observed that the number of the last high-bit pages in the conventional programming (FIG. 9A) is greater than the number of the last high-bit pages in the novel conventional programming (FIG. 9B). As a result, the twice-program method using the novel program sequence has better performance over the twice-program using the conventional program sequence.

Although specific embodiments have been illustrated and described, it will be appreciated by those skilled in the art that various modifications may be made without departing from the scope of the present invention, which is intended to be limited solely by the appended claims.

What is claimed is:

1. A method of twice programming a multi-bit per cell non-volatile memory, comprising:
firstly programming at least one page of at least one word line with program data by a controller of the non-volatile memory; and
secondly programming said at least one page of at least one word line with the same program data by the controller;
wherein the firstly programming step comprises:
firstly programming less-significant-bit page or pages;
determining first most-significant-bit pre-verify voltages; and
firstly programming a most-significant-bit page using the first most-significant-bit pre-verify voltages and first most-significant-bit pass-verify voltages; and
wherein the secondly programming step comprises:
determining second most-significant-bit pre-verify voltages; and
secondly programming the most-significant-bit page using the second most-significant-bit pre-verify voltages and second most-significant-bit pass-verify voltages.

2. The method of claim 1, wherein the multi-bit per cell non-volatile memory is a two-bit per cell flash memory, a three-bit per cell flash memory or a four-bit per cell flash memory.

3. The method of claim 1, wherein said at least one page is a high-bit page.

4. The method of claim 1, wherein the second most-significant-bit pre-verify voltages and the first most-significant-bit pre-verify voltages respectively have substantially same read results.

5. The method of claim 1, wherein the second most-significant-bit pass-verify voltages are respectively greater than or equal to the first most-significant-bit pass-verify voltages.

6. A method of programming/reading a multi-bit per cell non\-volatile memory with a sequence, comprising:
programming a plurality of less-significant-bit pages; and
programming a plurality of consecutive most-significant-bit pages of a plurality of consecutive word lines one after the other in a consecutive order;
wherein the step of programming the less-significant-bit pages comprises:
programming a plurality of low-bit pages in at least one memory block; and
programming a plurality of the less-significant-bit pages other than the low-bit pages in the at least one memory block; and
wherein the step of programming or reading the consecutive most-significant-bit pages comprises:
programming a plurality of high-bit pages in the at least one memory block.

7. The method of claim 6, wherein the multi-bit per cell non-volatile memory is a two-bit cell flash memory, a three-bit per cell flash memory or a four-bit cell flash memory.

8. A method of twice programming a multi-bit per cell non-volatile memory with a sequence, comprising:
firstly programming at least one page at a given word line with program data by a controller of the non-volatile memory; and
secondly programming at least one page at a word line preceding the given word line with the same program data firstly programmed in said at least one page at said word line preceding the given word line by the controller;
wherein a plurality of pages of a plurality of consecutive word lines are secondly programmed one after the other in a consecutive order.

9. The method of claim 8, wherein the multi-bit per cell non-volatile memory is a two-bit per cell flash memory, a three-bit per cell flash memory or a four-bit per cell flash memory.

10. The method of claim 8, wherein said at least one page at the word line preceding the given word line is a high-bit page.

11. The method of claim 8, after the firstly programming step, further comprising:
checking the non-volatile memory to find any failed word line that is associated with fail bits greater than or equal to a predetermined value;
wherein data stored in a page at the failed word line are read and kept by the controller, followed by secondly programming the page at the failed word line if the check result is positive.

12. The method of claim 8, after the firstly programming step, further comprising:
checking the non-volatile memory to find any failed word line that is associated with fail bits greater than or equal to a predetermined value;
wherein page data associated with a plurality of the word lines of the non-volatile memory are read and kept by the controller, followed by secondly programming the pages at said plurality of word lines of the non-volatile memory if the check result is positive.

13. The method of claim 8, before secondly programming the at least one page, further comprising reading and keeping page data of the corresponding word line or word lines by the controller.

* * * * *